United States Patent [19]

Jensen et al.

[11] Patent Number: 5,453,701
[45] Date of Patent: Sep. 26, 1995

[54] BARE DIE TEST AND BURN-IN DEVICE

[75] Inventors: Ronald J. Jensen, Bloomington; Michael A. Mitchell, Minnesota, both of Minn.

[73] Assignee: Honeywell Inc., Minneapolis, Minn.

[21] Appl. No.: 200,855

[22] Filed: Feb. 22, 1994

Related U.S. Application Data

[63] Continuation of Ser. No. 996,282, Dec. 23, 1992, abandoned.

[51] Int. Cl.$^6$ .............................. G01R 31/02; G01R 1/073
[52] U.S. Cl. .................. 324/755; 324/158.1; 324/754
[58] Field of Search ................................ 324/754, 755, 324/158.1, 72.5; 439/68, 71

[56] References Cited

U.S. PATENT DOCUMENTS

| | | | |
|---|---|---|---|
| 4,922,192 | 5/1990 | Gross et al. | 324/158 P |
| 5,066,907 | 11/1991 | Tarzwell et al. | 324/158 P |
| 5,148,103 | 9/1992 | Pasiecznik, Jr. | 324/158 F |

OTHER PUBLICATIONS

1991 Proceedings of International Electronics Packaging Conference.
International Electroics Packaging Society *Improving MCM Assembly Yields Through Approaches for Known-Good ICs*, by Russell J. Wagner and John K. Hagge, pp. 882–897.

*Primary Examiner*—Ernest F. Karlsen
*Attorney, Agent, or Firm*—Gregory A. Burns

[57] ABSTRACT

Bare die test device for making temporary electrical connections between bonding pads on the die and external test connectors includes a die chuck, a fanout substrate, and a substrate chuck. The fanout substrate has conductive bumps spaced for registration with die bonding pads. A die chuck receives the die and a substrate chuck holds the fanout substrate. In a fixed alignment embodiment, an alignment arrangement between the die chuck and the substrate chuck provides registration. In an alternative embodiment, the fanout substrate has a backside etched cavity exposing a transparent compliant material. A lower frame provides for lateral and angular positioning of the die chuck relative to the substrate chuck to bring the conductive bumps into alignment with the bonding pads, while visually observing the alignment through the transparent material.

21 Claims, 5 Drawing Sheets

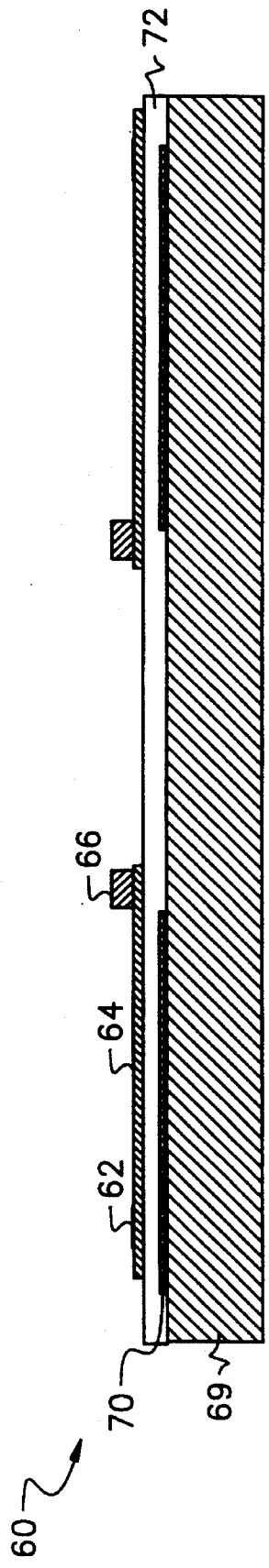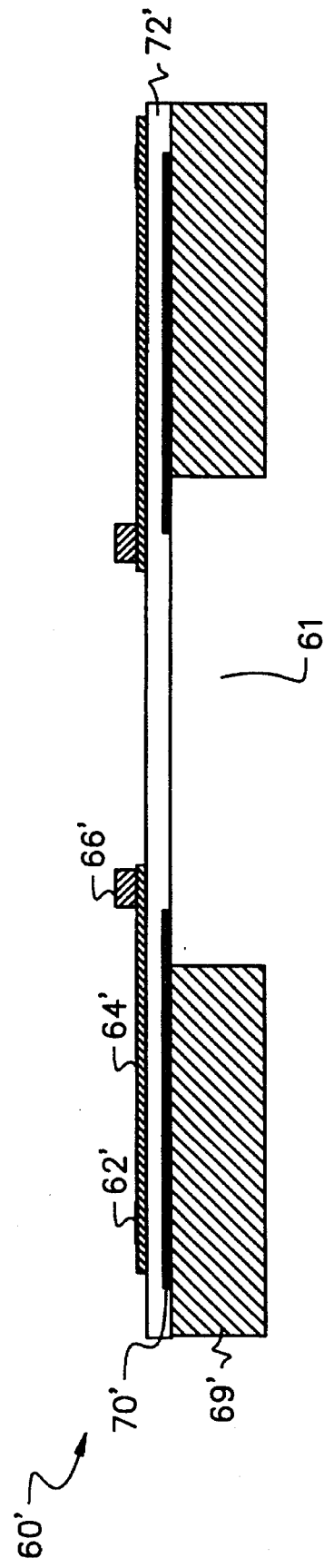

5,453,701

BARE DIE TEST AND BURN-IN DEVICE

This application is a continuation, of application Ser. No. 07/996,282, filed Dec. 23, 1992, now abandoned.

BACKGROUND OF THE INVENTION

The present invention relates generally to devices for use in the testing and burn-in of integrated circuits (IC's) and particularly to devices for the testing and burn-in of IC's that are intended for use in multichip modules (MCMs).

When ICs are packaged into MCMs it is important to have a high level of confidence that the ICs will meet the electrical requirements and survive an infant morality test or "burn-in" before assembling them into MCMs. A quality level in excess of 99 percent for individual ICs is desirable.

Typically, ICs must be assembled into a package before conducting full electrical tests and burn-in. If the IC is to be packaged into an MCM, it must then be removed from the package and re-assembled into the MCM. This removal and repackaging process can cause damage to the die and is not practical for high pin count ICs.

In the past, various methods for testing and burning in individual die have been used. Tape Automated Bonding (TAB) has been used to attach the die to a leadframe which fans out the bonding pads and can be mounted in a test fixture. Sacrificial packaging has been used therein the die is mounted and wire bonded into a single chip package, and then removed after testing and burning in. A third approach has been to bond the die to a fanout substrate by wire bonding or flip chip solder reflow, and then excise the substrate or break the solder bonds after the test and burn in procedure. The past methods all require metallurgical connections to the pads of the bare die and thus have the problems associated with the removal of these connections.

Thus a need exists for a carrier or fixture that will serve as a temporary package for a single as processed IC or bare die and provide an electrical and mechanical interface to test and burn in equipment. The need is for a fixture that makes electrical connections between all of the bonding pads on the die and the corresponding external connectors and also permits easy insertion and removal of the die without physically damaging it in any way.

SUMMARY OF THE INVENTION

The present invention solves these and other needs by providing a device for use in making temporary electrical connections between bonding pads on a bare die and external connectors. A fanout substrate having conductive bumps spaced for registration with the bonding pads and a substrate chuck for holding the substrate are provided. A die chuck for receiving the die has a passage for the external electrical connectors to pass through. In a fixed alignment embodiment, an alignment arrangement positions the substrate chuck onto the die chuck so that the conductive bumps contact the bonding pads.

In an alternative adjustable alignment embodiment, the fanout substrate has a backside etched cavity exposing a transparent material. A lower frame maintains the substrate chuck in a fixed lateral position while holding the die chuck and providing for lateral and angular positioning of the die chuck to bring the conductive bumps into alignment with the bond pads while observing the alignment through the transparent material. A uniform force applied to the backside of the transparent material forces the conductive bumps against the bonding pads.

BRIEF DESCRIPTION OF THE DRAWINGS

FIG. 2a is an enlarged cross-sectional drawing of the fanout substrate shown in FIG. 1a.

FIG. 2b is an enlarged cross-sectional drawing of the fanout substrate shown in FIG. 1b.

DETAILED DESCRIPTION

Figure 1A:
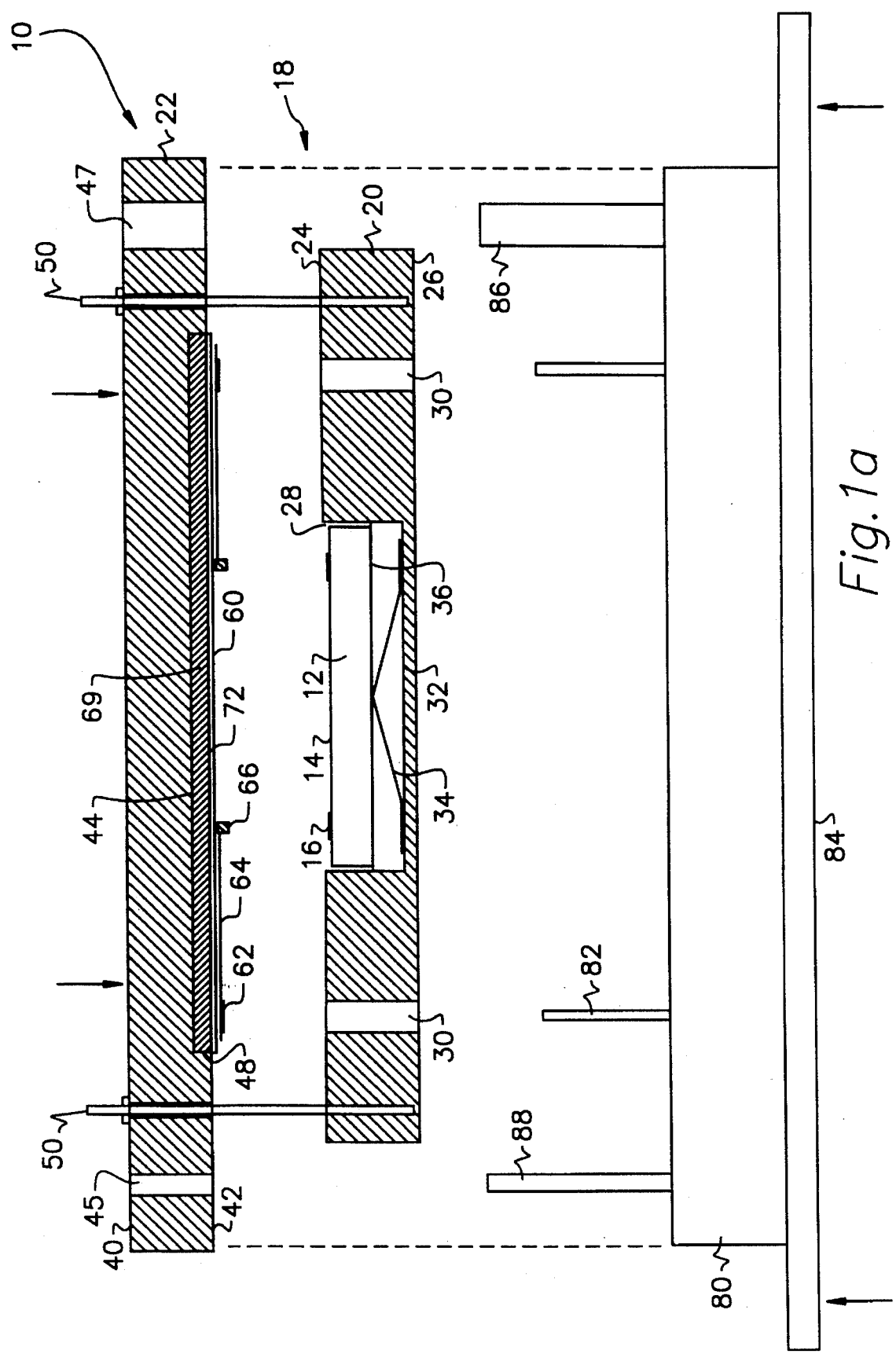
FIG. 1a is a cross-sectional drawing of an embodiment of a device for use in testing an integrated circuit die in accordance with the teachings of the present invention.

A device for use in testing a bare integrated circuit die is shown in the figures and generally designated 10. A bare integrated circuit die 12 includes upper surface 14. Bonding pads 16 are typically located near the perimeter of upper surface 14.

Device 10 according to the teachings of the present invention includes a carrier 18. Carrier 18 includes die chuck 20 and substrate chuck 22. Die chuck 20 includes upper surface 24, lower surface 26 and die opening 28. Die opening 28 is slightly larger than die 12 and has a bottom surface 32. Spring 34 rests on bottom surface 32. Die pressure plate 36 is spaced from bottom surface 32 and resiliently supported by spring 34. Die 12 rests on die pressure plate 36. Die chuck 20 further includes holes 30 which extend from upper surface 24 to lower surface 26.

Substrate chuck 22 includes upper surface 40 and lower surface 42. Substrate chuck 22 also includes recess 44 having an edge 48. Hole 45 and hole 47 are also included in substrate chuck 22.

Carrier 18 also includes alignment and clamping mechanism 50.

Device 10 as illustrated in FIG. 2a includes a fanout substrate 60 that may be fabricated on a standard silicon wafer according to the procedure described hereinafter. Fanout substrate 60 includes contact pads 62, signal lines 64 and conductive bumps 66.

Figure 3:
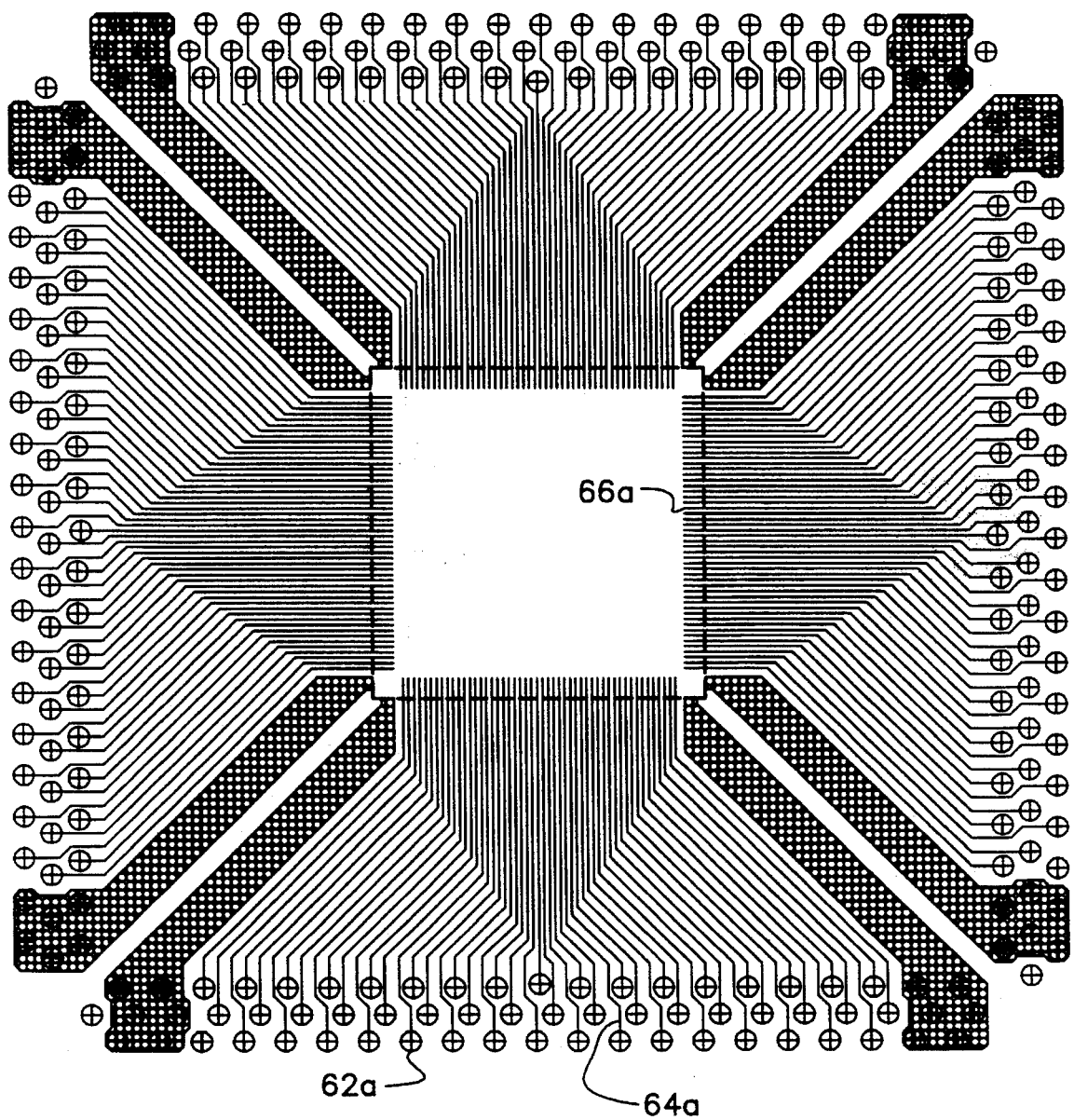
FIG. 3 is a plan view of a typical fanout pattern on a fanout substrate.

A typical fanout pattern for a fanout substrate 60a is illustrated in FIG. 3 and includes contact pads 62a located near the perimeter of substrate 60a. Fanout lines or signal lines 64a are connected to contact pads 62a and extend inwardly where they terminate in conductive bumps 66a. FIG. 3 is only intended to illustrate a typical fanout pattern.

Figure 2C:
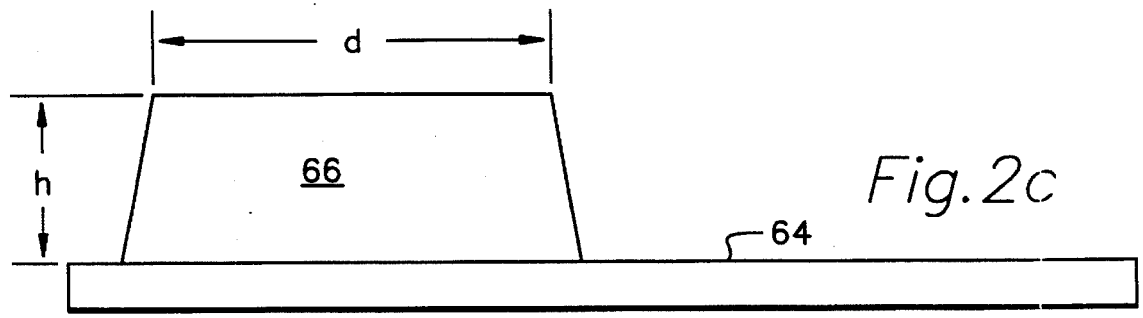
FIG. 2c is a detail drawing of a portion of the fanout substrate of FIG. 2a and FIG. 2b.

Thus, fanout substrate 60 has a pattern of signal lines 64 that redistribute the closely spaced bumps 66 to contact pads 62 that can be contacted by external electrical connectors such as conventional pogo pins as described hereinafter. By way of example, but not by way of limitation, closely spaced bumps, e.g., 0.006 inch pitch may be distributed to more widely spaced pads, e.g., rows of pads on 0.050 inch centers. Referring to FIG. 2a, a partial sectional view further illustrates fanout substrate 60. Silicon substrate 69 would typically be metallized first to improve adhesion of a polymer to be spray deposited. A metallized layer will also provide a reference plane for controlled characteristic impedance of signal lines 64. This metallization is optional. A metallization layer 70 of Cr or TiW of approximately 1000 angstroms is recommended. The wafer is then coated with a polymer that has high thermal stability and mechanical strength such as polyimide. A polyimide layer 72 of 35 to 50 microns is recommended. Contact pads 62, signal lines 64 and conductive bumps 66 are then patterned on polyimide layer 72. Signal lines or fanout lines 64 are of high conductivity material, preferably gold or copper coated with gold and are preferably 1 to 3 microns thick and at least 50 microns wide. A thin layer of metal such as TiW or Cr should be used to improve adhesion of fanout connections 64 to polyimide 72. Referring to FIG. 2c, height h, of bumps 66 is preferably in the range of 10 to 30 microns and diameter d, is in the range of 10 to 90 microns. Bumps 66 preferably taper from a larger cross-section to a small cross-section in a direction away from signal lines 64. Other metals and techniques could be used, however, it is important that substrate 60 have no exposed oxidizable metal and that bumps 66 have some height and are tapered.

Device 10 is intended for use with external electrical connectors such as pogo pins making connection to contact pads. Accordingly, a pogo pin block 80 includes pogo pins 82 which extend upwardly from block 80 and are spring loaded. Pogo pin block 80 is electrically and mechanically connected to a burn in or test board 84. Pogo pin block 84 includes alignment pins 86 for aligning carrier 18 with pogo pin block 80 and bolts 88 for anchoring carrier 18 to block 80. Pogo pin block 80 and burn in board 84 are of generally conventional design. Alternatively, a custom socket may be used to interface carrier 18 to test or burn in board 84.

Now that the basic construction of bare die test and burn in device 10 has been disclosed, the method of use and subtle features of device 10 can be set forth and appreciated. To illustrate the operation use and advantages of the embodiment of device 10 illustrated in FIG. 1a and FIG. 2a it will be assumed that a bare die 12 has been placed on die pressure plate 36 within die chuck 20 and that a fanout substrate 60 has been placed in recess 44 of substrate chuck 22. The die and substrate may be held in their respective chucks using a temporary vacuum or springs.

In the embodiment illustrated in FIG. 1a and FIG. 2a, which will be referred to as a fixed alignment embodiment, bumps 66 on substrate 60 must be aligned with bonding pads 16 on die 12. This alignment is achieved by designing device 10 so that when die 12 and substrate 60 wafer sawing tolerances are considered and when the manufacturing tolerances for device 10 are considered, device 10 will provide alignment or registration of bumps 66 with bonding pads 16 when die 12 is placed in die opening 28 and substrate 60 is placed in recess 44 against edge 48. Critical tolerances would include the location and size of die opening 28, the location and size of recess 44 and the location of alignment and clamping mechanism 50. Following the placement of die 12 and substrate 60, Substrate chuck 22 will be aligned by means of a fixed alignment and clamping mechanism 50. Substrate chuck 22 will then be clamped to die chuck 20 using this alignment and clamping mechanism. Carrier 18 will then be aligned by alignment pins 86 and placed on pogo pin block 80. External test connectors or pogo pins 82 will then extend through holes 30 and make contact with contact pads 62.

Figure 1B:
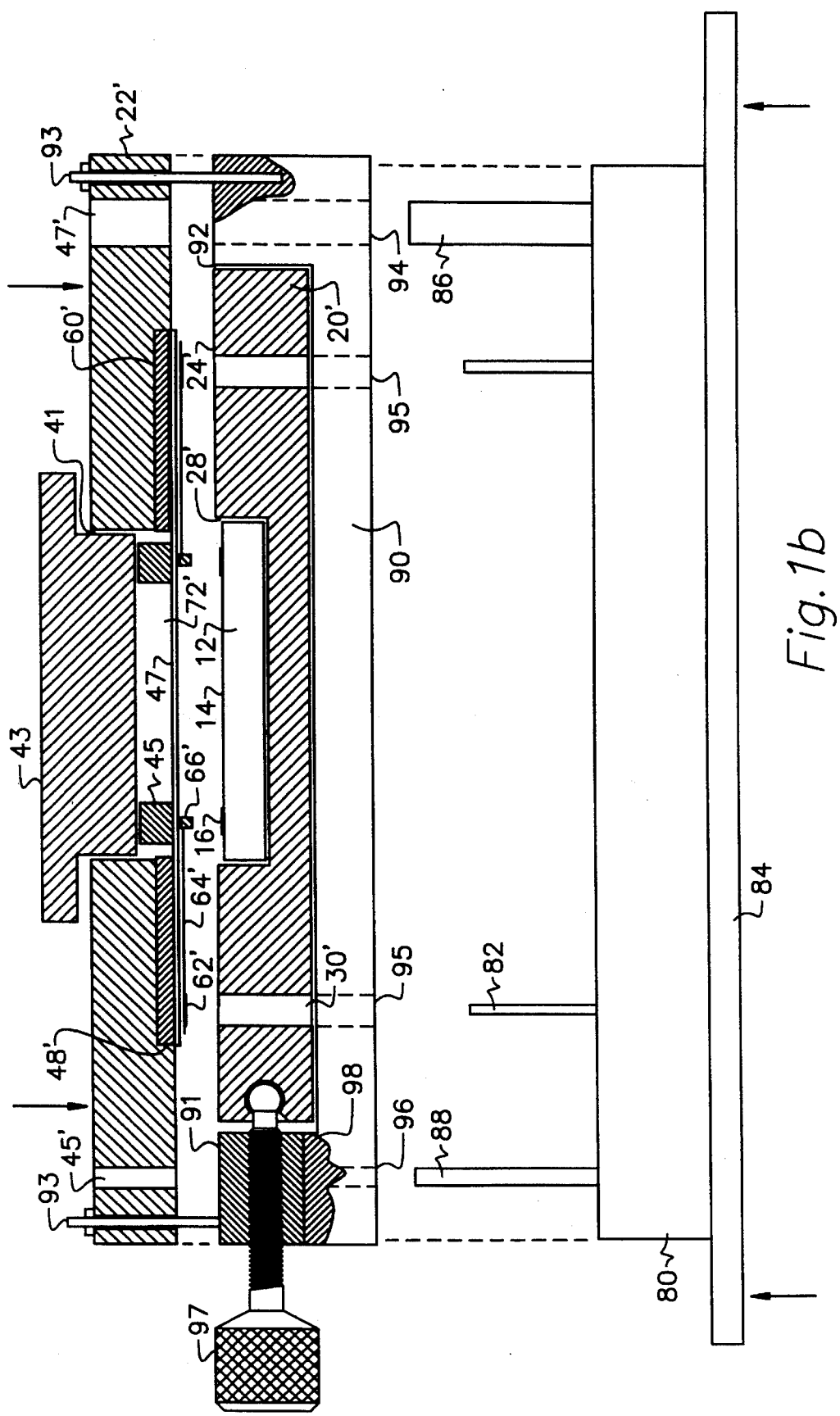
FIG. 1b is a cross-sectional drawing of an alternate embodiment of a device for use in testing an integrated circuit die in accordance with the teachings of the present invention.
Figure 4:
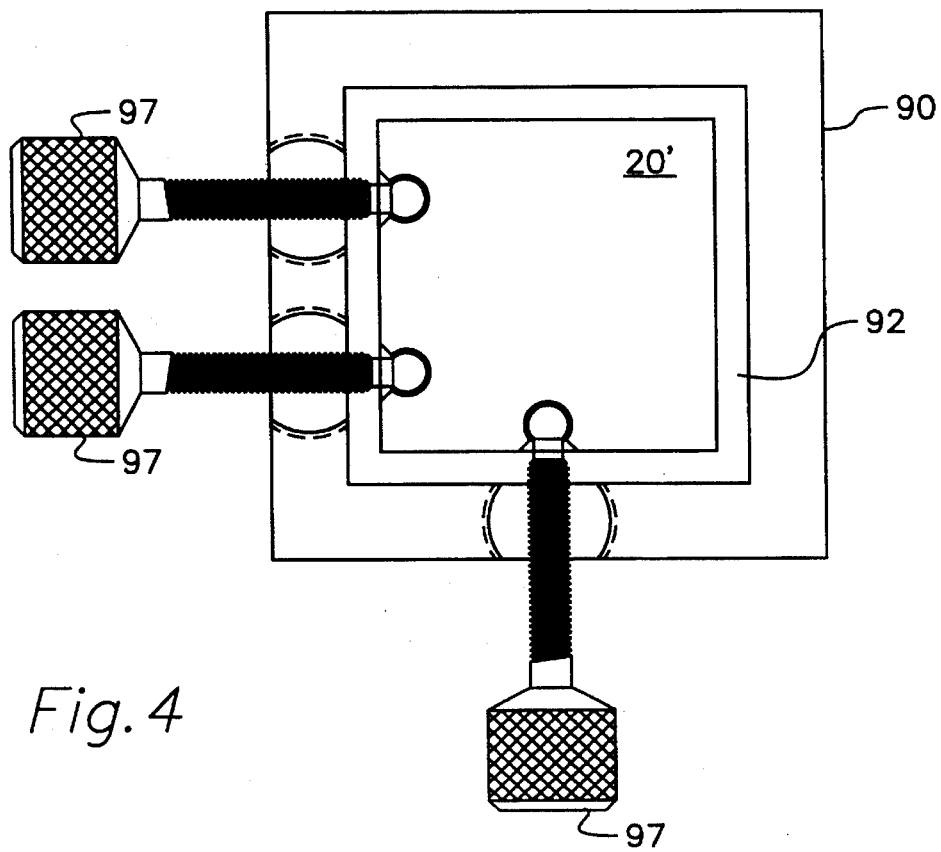
FIG. 4 is a reduced size plan view of an alternate embodiment of the present invention.

An alternate embodiment of device 10 is shown in FIGS. 1b and 2b. In the alternate embodiment shown, numerals designated with ' are used for similar parts. Lower frame 90 has an upper surface 91 and includes a cavity 92 which is laterally sized to be slightly larger than die chuck 20'. Alignment and clamping mechanism 93 extends between lower frame 90 and substrate chuck 22' and both aligns and clamps substrate chuck 22' to lower frame 90. Holes 94 extend, through lower frame 90 and holes 47' extend through upper frame 22' to allow alignment pins 86 to pass through. Holes 96 extend through lower frame 90 and holes 45' extend through upper frame 22' to allow bolts 88 to pass. Holes 95 extend through lower frame 90 to allow pogo pins 82 to pass through. Lower frame 90 also includes adjustment screw mechanism 97 extending through lower frame 90 and providing a means for laterally and angularly positioning die chuck 20' within cavity 92. Adjustment screw mechanism 97 may be a standard micrometer device mounted in the wall of lower frame 90 and engaging die chuck 20'. Three point alignment as shown in FIG. 4 provides for lateral and angular movement, sometimes referred to as x, y, and theta movement, of die chuck 20'.

Substrate chuck 22' includes opening or passage 41 extending through a central portion of substrate chuck 22'. Fanout substrate 60' has a backside etched cavity 61 etched in silicon substrate 69'. Membrane pressure element 43 is sized to be received in opening 41. Elastomer ring 45 rests on backside 47 of polymer layer 72' when fanout substrate 60' is positioned in chuck 22'. The backside cavity etch is a commonly used process in the fabrication of silicon pressure sensors and the cavity etch can be performed after fanout lines or signal lines 64' have been patterned. Since polymer membrane 72' is transparent, cavity 61 permits visual alignment of conductive bumps 66' to bonding pads 16. Flexible polymer layer or membrane 72' also compensates for die 12 camber and variations in height of bonding pads 16 and bumps 66'. Thus, when membrane pressure element 43 is positioned in opening 41 and forced against elastomer ring 45, an equal contact force is applied to all of bumps 66'.

To illustrate the operation, use, and advantages of the alternate embodiment of device 10 illustrated in FIG. 1b and FIG. 2b the procedure may be described as follows. A bare die 12 will be placed in die opening 28' within die chuck 20' and a fanout substrate 60' will be placed in recess 44 of substrate chuck 22'. The die and substrate may be held in their respective chucks using a temporary vacuum or springs. Die chuck 20' is placed in cavity 92 of lower frame 90 with pogo pins 82 extending through openings 30'. Substrate chuck 22' is placed on lower frame 90 with alignment and clamping mechanism 93 providing alignment of substrate chuck 22' with lower frame 90 and clamping substrate chuck 22' to lower frame 90. The location of bonding pads 16 relative to the location of conductive bumps 66' may be visually observed through transparent polyimide layer 72. Through the use of adjustment screws 97, die chuck 20' may be positioned to bring conductive bumps 66' into alignment or registration with bonding pads 16. When alignment is achieved, elastomer ring 45 is placed on backside 47 of polyimide 72 and membrane pressure element 43 is placed on elastomer ring 45. Force is then applied to membrane pressure element 43 which will bring conductive bumps 66' into contact with bonding pads 16. Clamping means may be provided to hold membrane pressure element 43 in position during test and burn in operations. Completed assembly including die chuck 20', lower frem 90, and substrate chuck 22', is placed on pogo pin block 80 with alignment pins 86 extending through holes 94 and 47', bolts 88 extending through holes 96 and 45', and pogo pins 82 extending through holes 95 to complete electrical connection between bonding pads 16 and external connectors or pogo pins 82.

Figure 5:
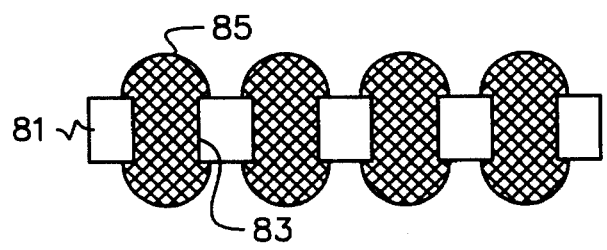
FIG. 5 is an enlarged cross-sectional view of a conductive film.

An anisotropically conducting film may be placed between die 12 and substrate 60 in the fixed alignment embodiment of FIG. 1a and FIG. 2a or between die 12 and substrate 60' in the adjustable alignment embodiment of FIG. 1b and 2b. As illustrated in FIG. 5, the conducting film is a free standing polymer film 81 with via holes 83 on a 15–25 micron pitch for example. Via holes 83 are filled with metal and capped with metal bumps 85 on both ends. The film permits electrical conduction through the film, but electrical isolation in the plane of the film. Anisotropically conductive adhesives may also be used to improve the electrical contact between the conductive bumps and the bonding pads. These materials are loaded with conductive particles that permit electrical conduction in the vertical direction between closely spaced pads, but are electrically insulating in the plane of the film. The anisotropic adhesive is applied in paste or liquid form, and shrinks during cure to bring the bumps and die pads into electrical contact. The adhesive is dissolved after testing to separate the fanout substrate and die.

Now that the construction and operation of device 10 have been set forth, many advantages can be set forth and appreciated. The thin film processes permit the patterning of closely spaced signal lines 64 and bumps 66.

Optional metallic reference plane 70 beneath polymer film 72 in the fixed alignment embodiment provides controlled impedance and reduces crosstalk between signal lines 64. This same feature exists in the adjustable alignment embodiment. This is an advantage when testing at high clock speeds or fast rise times.

Device 10 can be used to test standard as processed ICs and does not require special wafer bumping or assembly processes, as is the case in the TAB or flip chip approaches.

Device 10 eliminates the assembly and rework steps of sacrificial packaging approaches. In addition it does not damage or physically alter the bonding pads or backside of the die as may occur in sacrificial packaging. Further, the high density of conductive bumps 66 and signal lines 64 of the present invention makes it suitable for a very high number of bond pads. Other methods such as sacrificial packaging are limited to ICs with far fewer bonding pads.

Test and burn in fixture device 10 is made from an easily machined material, and is preferably made of aluminum.

Fanout substrates 60 are fabricated on standard silicon wafers used in IC fabrication. Several fanout substrates can be fabricated on each wafer. For example, a fanout substrate with 256 contact pads will be approximately 1.4 inches square and three of these substrates could be fabricated on a 4 inch wafer.

In accordance with the foregoing description, applicants have developed a simple, compact fixture that permits easy handling and transfer of a bare die between test and burn in operations. Device 10 interfaces with standard test and burn in devices in the same way as a single chip package. Thus, it is easily used in the test and burn in process for ICs intended for use in multichip modules.

Although a specific embodiment of applicant's invention is shown and described for illustrative purposes, a number of variations and modifications will be apparent to those of ordinary skill in the relevant arts. It is not intended that coverage be limited to the disclosed embodiment, but only by the terms of the following claims.

We claim:

1. Device for use in testing bare die, said device for making temporary electrical connections between bonding pads on said bare die and external test connectors comprising:

a fanout substrate having contact pads, conductive bumps and fanout conductors formed thereon with said fanout conductors interconnecting said contact pads and said conductive bumps;

a substrate chuck for holding said fanout substrate;

a die chuck for receiving said bare die, said die chuck having a passage;

means for aligning said conductive bumps with said bonding pads, with said external test connectors extending through said passage and contacting said contact pads; and means for bringing said conductive bumps and said bonding pads into contact.

2. Device of claim 1 wherein said means for aligning said conductive bumps with said contact pads comprises means for aligning said die chuck with said substrate chuck.

3. Device of claim 2 wherein said means for aligning said die chuck with said substrate chuck comprises alignment pins.

4. Device of claim 3 wherein said die chuck has resilient means for supporting said die.

5. Device of claim 3 wherein said means for bringing said conductive bumps and said bonding pads into contact comprises means for clamping said substrate chuck to said die chuck and resilient means for resiliently forcing said die toward said substrate.

6. Device of claim 1 wherein said fanout substrate comprises;

a silicon substrate;

a layer of compliant material formed on said silicon substrate with said contact pads, conductive bumps and fanout conductors formed thereon, with said conductive bumps being shaped, with said shaped conductive bumps and said compliant material improving said electrical connections between said conductive bumps and said bonding pads by permitting sufficient plastic deformation to compensate for a lack of planarity in said bonding pads and in said bumps.

7. Device of claim 6 wherein said conductive bumps are shaped to taper from a larger cross-section to a smaller cross-section in a direction away from said fanout conductors.

8. Device of claim 6 wherein said compliant material is polyimide.

9. Device of claim 8 wherein said fanout substrate has a metallic reference plane between said silicon substrate and said layer of compliant material, said metallic reference plane to provide controlled impedance of said fanout conductors and to reduce crosstalk between said fanout conductors.

10. Device of claim 9 further comprising a layer of anistoropically conducting material interposed between said conductive bumps and said bonding pads to improve electrical contact.

11. Device of claim 1 wherein said fanout substrate comprises:

a silicon substrate;

a layer of transparent compliant material formed on said silicon substrate with said contact pads, said conductive bumps and said fanout conductors formed thereon;

a backside etched cavity formed in said silicon substrate and exposing said transparent compliant material.

12. Device of claim 10 wherein said means for aligning said conductive bumps with said bonding pads comprises:

means for laterally and angularly positioning said die chuck relative to said substrate chuck to bring said conductive bumps into alignment with said bonding pads while observing said conductive bumps and said bonding pads through said transparent compliant material.

13. Device of claim 12 wherein said means for laterally and angularly positioning comprises:

a lower frame having an opening for receiving said die chuck, said substrate chuck being laterally fixed with respect to said lower frame;

adjustment means for laterally and angularly moving said die chuck within said lower frame.

14. Device of claim 13 wherein said adjustment means is a plurality of threaded means extending through said lower frame and abutting said die chuck, said plurality of threaded means movable within said frame.

15. Device of claim 14 wherein said means for bringing said conductive bumps and said bonding pads into contact comprises means for applying a distributed force to said exposed transparent material.

16. Device of claim 15 wherein said conductive bumps are shaped, with said shaped conductive bumps and said complaint material improving said electrical connections between said conductive bumps and said bonding pads by permitting sufficient plastic deformation to compensate for a lack of planarity in said bonding pads and in said bumps.

17. Device for use in testing bare die, said device for making temporary electrical connections between bonding pads on said bare die and external test connectors, comprising:

a silicon substrate having a polymer layer formed thereon with contact pads, conductive bumps and fanout conductors formed on said polymer layer, with said fanout conductors interconnecting said contact pads and said conductive bumps;

a backside etched cavity in said silicon substrate exposing said polymer layer, with said conductive bumps visible through said polymer layer;

a substrate chuck for holding said fanout substrate;

a lower frame, said lower frame holding said substrate chuck in a fixed lateral position spaced from said lower frame;

a die chuck for receiving said bare die, said die chuck having an opening permitting passage of said external connectors for making connection to said contact pads;

said lower frame having an opening for receiving said die chuck and an adjustment means for laterally and angularly moving said die chuck with respect to said substrate chuck to achieve alignment of said conductive bumps with said bonding pads; and means for applying a uniform distributed force to said exposed polymer layer to move said conductive bumps into contact with said bonding pads.

18. Device of claim 17 wherein said conductive bumps are shaped, with said shaped conductive bumps and said polymer layer improving said electrical connections between said conductive bumps and said bonding pads by permitting sufficient plastic deformation to compensate for a lack of planarity in said bonding pads and in said bumps.

19. Device of claim 18 wherein said conductive bumps are shaped to taper from a larger cross-section to a smaller cross-section in a direction away from said fanout conductor.

20. Device of claim 18 wherein said fanout substrate has a metallic reference plane between said silicon substrate and said layer of compliant material, said metallic reference plane to provide controlled impedance of said fanout conductors and to reduce crosstalk between said fanout conductors.

21. Device of claim 20 further comprising a layer of anistoropically conducting material interposed between said conductive bumps and said bonding pads to improve electrical contact.

* * * * *